United States Patent
Gielniak

(10) Patent No.: US 7,714,736 B2
(45) Date of Patent: May 11, 2010

(54) ADAPTIVE FILTER ALGORITHM FOR ESTIMATING BATTERY STATE-OF-AGE

(75) Inventor: Michael J. Gielniak, Romeo, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 358 days.

(21) Appl. No.: 11/927,785

(22) Filed: Oct. 30, 2007

(65) Prior Publication Data

US 2009/0109046 A1 Apr. 30, 2009

(51) Int. Cl.
*G08B 21/00* (2006.01)

(52) U.S. Cl. .............. 340/636.1; 340/636.11; 340/636.12; 340/636.18; 340/636.19; 320/104; 320/161; 324/426; 324/427; 324/428; 324/435

(58) Field of Classification Search ... 340/636.1–636.2, 340/438–439, 455; 320/104, 149, 161; 324/426–435
See application file for complete search history.

(56) References Cited

U.S. PATENT DOCUMENTS

| | | | | |
|---|---|---|---|---|
| 5,278,509 A * | 1/1994 | Haynes et al. | .............. | 324/427 |
| 5,686,815 A * | 11/1997 | Reipur et al. | .............. | 320/116 |
| 5,691,621 A * | 11/1997 | Phuoc et al. | ............... | 320/134 |
| 6,087,808 A * | 7/2000 | Pritchard | .................... | 320/132 |
| 6,204,769 B1 * | 3/2001 | Arai et al. | .................. | 340/632 |
| 6,424,157 B1 * | 7/2002 | Gollomp et al. | ............. | 324/430 |
| 6,842,708 B2 * | 1/2005 | Odaohhara | ................... | 702/63 |
| 6,885,167 B2 * | 4/2005 | Palanisamy et al. | ......... | 320/104 |
| 7,078,877 B2 * | 7/2006 | Salasoo et al. | ............. | 320/104 |
| 7,129,675 B2 * | 10/2006 | Brecht | ....................... | 320/137 |
| 7,208,914 B2 * | 4/2007 | Klang | ....................... | 320/132 |
| 7,212,006 B2 * | 5/2007 | Huang | ....................... | 324/430 |
| 7,429,849 B2 * | 9/2008 | Shoji | ......................... | 320/150 |
| 7,541,775 B2 * | 6/2009 | Lee | ........................... | 320/132 |
| 7,619,417 B2 * | 11/2009 | Klang | ....................... | 324/427 |
| 2008/0183408 A1 * | 7/2008 | Matsuura et al. | ............. | 702/63 |
| 2009/0024339 A1 * | 1/2009 | Shoji | ........................ | 702/63 |
| 2009/0099799 A1 * | 4/2009 | Barsoukov et al. | ........... | 702/63 |

* cited by examiner

*Primary Examiner*—Daniel Wu
*Assistant Examiner*—Son M Tang
(74) *Attorney, Agent, or Firm*—Quinn Law Group, PLLC

(57) ABSTRACT

A system for and method of estimating the state-of-age of a secondary cell utilizing an adaptive group filter algorithm, includes battery current, voltage, and temperature sensors, a communication device, and a controller communicatively coupled to the sensors and device, configured to filter data by analyzing only sample data points from instantaneous charge or discharge events, selecting only a sample of n instantaneous points for further regression, including n/2 charge event points and n/2 discharge event points, and separately averaging the charge and discharge event points, and further configured to determine the state-of-age by determining a resistance slope based on the rate of current and voltage change between the averages of the points, and matching the slope to a calibrated scalar or relational database.

20 Claims, 4 Drawing Sheets

ADAPTIVE FILTER ALGORITHM FOR ESTIMATING BATTERY STATE-OF-AGE

BACKGROUND OF THE INVENTION

1. Field of the Invention

The present invention relates to systems and methods of measuring, estimating, or otherwise determining the state-of-age of a battery, and more particularly to an improved method of estimating state-of-age including the steps of storing a data bucket of instantaneous charge or discharge points, averaging the points, determining a parameter based on a rate of change in the averaged points, and comparing the parameter to a scalar or database.

2. Discussion of Prior Art

It is often desirous to determine the state-of-age (also referred to herein as "age"), so as to predict the remaining life (i.e., the remaining period of viability) of a battery in use; and in certain applications, such as vital sign monitoring equipment or remote vehicle operation it can be critical. With respect to vehicular use, for example, the battery has been described as the heart of the electrical system and typically presents a conventional, lead-acid, AGM, or hybrid secondary (i.e., rechargeable) cell configuration.

It is well appreciated by those of ordinary skill in the art that where a battery has transcended its useful life, it ceases to be able to hold a charge despite connection to a fully functioning charging system. This makes the essentiality of providing accurate and reliable means for determining battery state-of-age readily apparent. Unfortunately, determining battery state-of-age is not simply a measure of its manufacture date. For example, it is also appreciated that battery age is dependant upon the level of daily discharge experienced. That is to say, a battery undergoing an average daily discharge of 10 percent may have a life that is five times as long as one discharged daily at 50 percent.

Conventionally battery inquiries regarding age or viability formerly involved a technician using a voltmeter to perform a multitude of tests, including a state-of-charge and/or battery capacity load test. More recently means of estimating battery age (also known as state-of-life or state-of-health (SOH)) have been included within a battery state estimator ("BSE") module. Controllers programmably equipped with these modules are configured to sample sensor data at high rates, and subsequently extract battery parameters by utilizing model regression/fitting techniques, or taking known endpoints and assumed/interpolated trends between age endpoints. In addition to battery age, these modules constantly determine other conditions, including whether and to what extent the battery is recharging. Finally, the parameters may be requested by and/or autonomously determined so as to provide information to another node within a communication network or an operator.

It is also appreciated by those of ordinary skill in the art that one extractable parameter, "high frequency" (e.g., internal 100-millisecond) resistance, exhibits a strong, distinct trend with and therefore may be used to determine battery age. More particularly, from the value of the regressed resistance and other known quantities, such as for example in a vehicular application, the power requirement to crank the engine, the interested node or operator can discern the age of the battery and therefore predict the remaining life. It is further appreciated that for all battery chemistries seen to date, the higher the frequency the stronger the trend is with respect to increasing battery age. Therefore, in conventional BSE methodology, the highest possible frequency resistance (DC resistance) has been elicited from the battery under the most instantaneous demands (i.e. high current/power demands over very short periods), which typically occur when a vehicle is cranking for example.

A concern arising when using conventional BSE modules, however, is that they typically present all-or-nothing functionality. That is to say, their current algorithms involve more data retrieval and computation than is necessary to extract only the data needed to determine battery age for example. Of further concern, these modules are also configured to manipulate input signals in order to improve reliability, making them overly complex for applications requiring only battery age information. Thus, it follows that these modules present inefficient means of determining only one parameter, such as battery age, which results in increased energy consumption, communication load and other operational/networking costs.

Another prior art method of performing autonomous battery life prediction involves a direct measurement technique utilizing electrochemical impedance spectroscopy ("EIS"). This method requires imposing a small input signal to the battery at a predefined frequency, and enables accurate impedance response measuring. Concernedly, however, this technique requires that the measurement device remains stable during the measurement process, so that the sensory cables remain free of induced electromagnetic noise. This is especially concerning in a vehicular setting, due to an abundance of uneven and poorly repaired roadways, as well as unavoidable driver caused eccentricities. Moreover, in this configuration, the sampled battery must be disconnected from parallel impedances during measurement. Of yet further concern regarding EIS systems, is the requirement of additional hardware to induce the necessary waveform. For these reasons and more, EIS systems have not been readily implemented and as such have received low market penetration.

As societal dependency upon electric power increases, so too does the need for reliable battery life prediction. This is especially the case when it comes to vehicular use, where there remains a need in the art for a more efficient yet accurate method of determining battery state-of-age.

BRIEF SUMMARY OF THE INVENTION

Responsive to this need, the present invention concerns a system and method of estimating battery state-of-age utilizing an adaptive filter algorithm. In comparison to the prior art, including BSE modules, a more efficient algorithm is presented that saves computation time, is more robust to input data, and requires less stringent control of inputs and data sample rates. The inventive method does not require that a model be developed for the battery, making it more portable between applications in less time. The algorithm acts as a compound filter, thereby eliminating the need for additional filtering structure. Because the algorithm is fully adaptive, it is insensitive to fluctuations and applicable over all battery operating states, including temperature and state-of-charge. Finally, the inventive algorithm provides significantly reduced excitation thresholds in the input data, in comparison to existing BSE modules.

The invention can be used to determine the age of a battery for any electrical device, which uses that battery with high transient (current and/or power) demands throughout the device life. The invention is further useful for providing a battery life prediction method that requires minimal controller memory (RAM & ROM) and utilizes conventional current and voltage sensors, so that minimal hardware additions and/or modifications are necessary. As such, in a vehicular setting, the inventive algorithm may be readily implemented in conventional 12V Lead Acid starter battery engines or with any hybrid or electric vehicle for which the battery life is required to be predicted. Moreover, the output of the newly proposed algorithm could be used to assist existing BSE modules in calculation of state-of-charge (SOC) and power predictions, as well as independently predicting battery life.

In a preferred embodiment, the invention is adapted for estimating the state-of-age of a secondary cell, and includes a first step of concurrently sensing a current supplied to and voltage drop across the cell over a sampling period, so as to generate synchronized current and voltage signals. The current signal is analyzed with respect to time, so as to determine a rate of current change and an instantaneous charge or discharge event based on the rate of current change. If an instantaneous event is determined, a correlative pair of candidate current and voltage drop values is determined based on the current and voltage signals. Next, a number of previously determined sample data points from like instantaneous events are determined within the sampling period and the pair is stored as a sample data point, if the number of previously determined sample data points is less than a minimum quantity, or if the candidate current value is greater than each of the current values of the previously determined sample data points. The current and voltage drop values of the sample data points are averaged, when the number of stored points reaches the minimum quantity for each of the instantaneous charge and discharge events, and the change in the average current values between the charge and discharge events divided by the change in the average voltage drop values between the charge and discharge events is determined, so as to calculate a resistance slope. Finally, a battery state-of-age is determined based on the slope.

Other aspects and advantages of the present invention, including consideration of temperature enabled by the further inclusion of a temperature sensor, detailed description of the use of data buckets for additional filtering, comparison of the slope to a calibrated scalar or relational database, and exemplary formulas for determining the calibrated scalar will be apparent from the following detailed description of the preferred embodiment(s) and the accompanying drawing figures.

BRIEF DESCRIPTION OF THE SEVERAL VIEWS OF THE DRAWING

A preferred embodiment(s) of the invention is described in detail below with reference to the attached drawing figures, wherein.

DETAILED DESCRIPTION OF THE INVENTION

Figure 1:
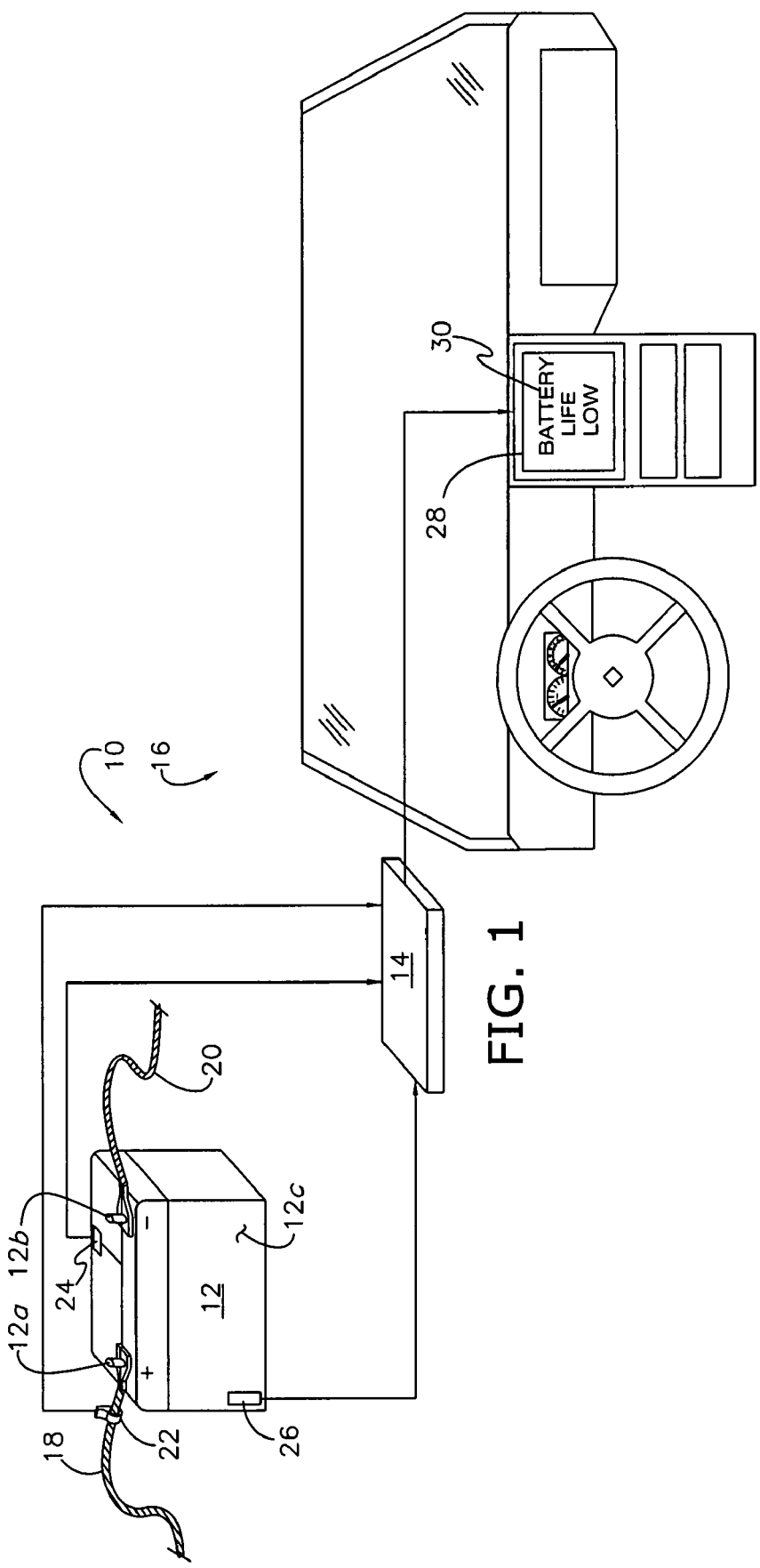
FIG. 1 is a perspective view of a battery age estimation system in accordance with a preferred embodiment of the invention, particularly illustrating current, voltage drop, and temperature sensors (schematically shown), a controller, and an in-vehicle monitor, as applied to a secondary cell.

The present invention concerns a system 10 configured to execute an adaptive algorithm for efficiently determining the state-of-age of a battery 12 active within a completed circuit. More particularly, the algorithm is configured to estimate the true impedance (i.e., resistance) of the battery 12. The algorithm is executable by at least one electronic control unit or controller 14, such as the main CPU of a vehicle 16, or a laptop removably interconnectable thereto, and as such is programmably inputted therein. Suitable memory storage, source code and processing capability necessary for execution is readily determinable by those of ordinary skill in the art, and as such will not be discussed herein. The system 10 and method of use are described and illustrated herein with respect to vehicular battery use, as shown in FIG. 1; however, it is appreciated that the benefits and advantageous of the invention may be utilized with other devices, such as smart devices, laptops, and other portable electronic/digital devices where knowing battery age is desirous. More particularly, the inventive algorithm can be used to estimate the age of the battery for any electrical device that uses that battery with high transient current and/or power demands throughout the device life.

I. General Configuration and Function

In FIG. 1, the system 10 is shown applied to a secondary cell (i.e., a rechargeable battery) 12 within a vehicle 16. For example, the cell 12 may be a conventional 12V PbA (lead acid starter) or 12V NiMH (hybrid, high power) battery 12, such as the type interconnectable to the vehicle 16 by conventional positive and negative lead cables 18,20 having brass clamps. As typical, the battery 12 preferably includes a positive post 12a that connects to positive members (not shown) interiorly disposed within an electrolytic medium (not shown) retained within a casing 12c, and a negative post 12b that connects to negative members (also not shown) also disposed within the medium. When a complete circuit is connected between the posts 12a,b, the lead positive members release cations to the medium and the negative members absorb the same therefrom. This process is known as "discharging" the battery 12 and presents a "discharge event." Conversely, when the charging system (not shown) of the vehicle 16, including the alternator, is in use, the reaction reverses so as to return the positive and negative members and electrolytic medium to their original states. More pertinently, during this "charging" process or "charge event" the alternator also relieves the battery 12 of its duties, thereby reducing the draw. Finally, a battery "cycle" is a complete process undergoing both discharge and charge events.

It is appreciated that most vehicle controllers are constant, fixed time controllers; that is to say, they execute at constant time rates. However, it is also appreciated that as the driver changes desired response at the pedals, other systems (e.g., engine, transmission, etc.) resolves these into variable battery power and/or current demands or input stimuli. Autonomous vehicular function may also vary power and/or current demand or input stimuli. Hybrid vehicles, for example, are typically configured to autonomously relax battery limits for crank events, so as to allow larger magnitudes of power and current to flow over shorter periods during engine "turn over." Furthermore, environmental conditions and system states also add variability to the demands on the battery 12.

With respect to state-of-age estimation, it is appreciated that the real part of battery impedance (i.e. resistance) is the dominant trend in secondary vehicular cells during rapid variations of current demand, and can be accurately measured at 20 Hz and greater input stimuli frequencies, as there are rarely inductive effects of influence at these frequencies. For this reason, the present invention is adapted for use during the most rapidly varying or "instantaneous" changes in demand and as such preferably presents an event-triggered algorithm.

Figure 2:
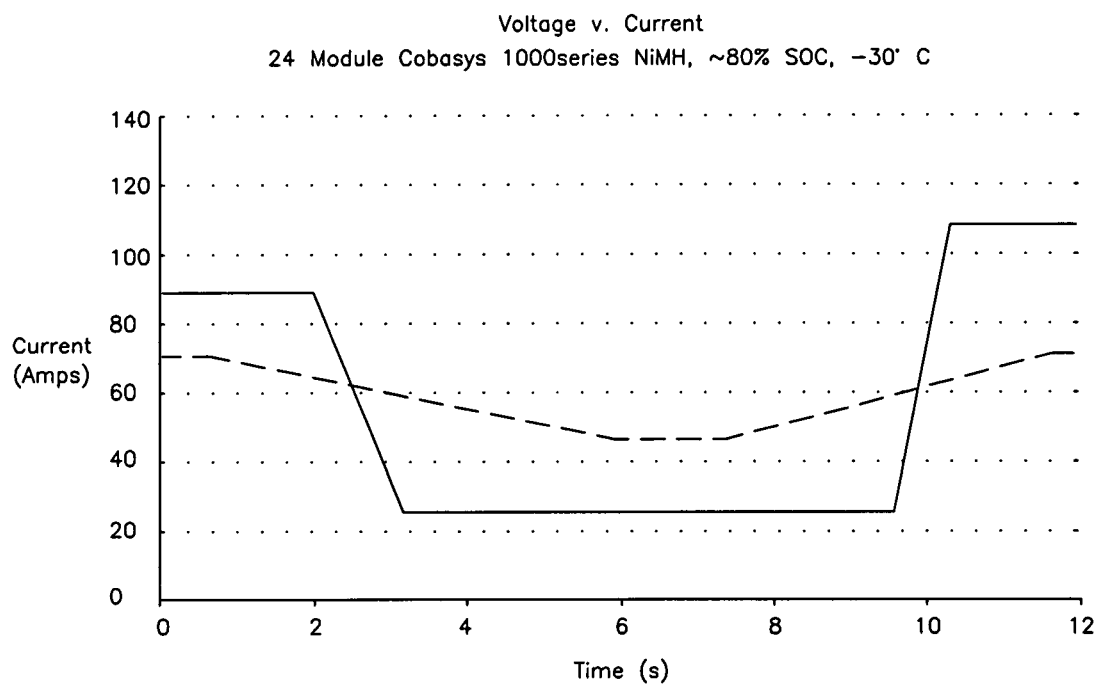
FIG. 2 is a line graph in amperes versus time showing an example of instantaneous charge and discharge events (solid line type) in comparison to regularly charging/discharging events (hidden line type)

As used herein, the term "instantaneous charge" shall mean a rapid charge event having a relatively small time duration and large magnitude of current (or power) applied to the battery, wherein energy is added. Likewise, "instantaneous discharge" is a rapid discharge event, wherein a large magnitude of current is removed from the battery in a relatively small time duration, and energy is lost. Both are dictated by two conditions, length and magnitude of application of a signal or draw from the vehicle 16. FIG. 2 is a line graph in amperes versus time of a complete battery cycle, including an instantaneous charge and an instantaneous discharge event.

In the present invention, a threshold ratio of current (or power) over time is utilized to determine an instantaneous event, and more preferably varies according to the intended application and use of the battery. It is appreciated that the threshold for instantaneity can greatly vary with application. For example, if a cell phone having an Imax~+/−5 A is sampled over 1 second, then $dI/dt=(5-(-5))/1=10$; but for a hybrid car battery having an Imax~+/−300 A sampled over 0.1 seconds then $dI/dt=(300-(-300))/0.1=6000$, wherein Imax is the maximum allowable current event that the system will receive from its control hardware and software during operation. Thus, in the illustrated embodiment, a preferred ratio of 1000 amperes/sec and more preferably 2000 amperes/sec is utilized as the threshold.

The sampling rate is preferably performed at a constant time step, so as to simplify instantaneity determination. In this configuration, the controller need only observe $ABS(I(t)-I(t-1))$ in real time; if this delta magnitude exceeds a predetermined delta-I threshold, it is determined to be an instantaneous event. Alternatively, instantaneity may be subjectively determined based on a historical analysis of charge and discharge events for a particular battery, wherein a percentile (e.g., 90 percentile) of events are deemed instantaneous.

Returning to FIG. 1, the inventive algorithm employs a plurality of sensors that communicate with the battery 12, including at least one current sensor 22, voltage sensor 24, and temperature sensor 26. As previously mentioned, one advantage of the invention is its application with conventional sensors used with existing BSE modules. The system 10 may include a current sensor 22 such as the type that circumspectly engages the positive lead cable 18 near the positive post 12a and is known in the art. As such, the current sensor 22 is configured to measure the current flowing from the battery in amperes (Amp) under electron flow theory. The battery voltage sensor 24 may be of the type having two leads measuring the voltage drop across the battery 12 (as schematically shown in FIG. 1), and the temperature sensor 26 may be a thermocouple attached to the battery or vehicular structure near the battery 12. The sensors 22-26 are coordinated so as to provide generally synchronous signals, and are each of a type having adequate range to cover anticipatory environments and resolution so that resistance can be accurately estimated to the requisite number of significant digits.

The sensors 22-26 may be wirelessly connected, such as through radio transmission, or connected by hard-wire to the controller 14. The sensors 22-26 are configured to periodically and more preferably continuously transmit respective signals to the controller 14. It is appreciated that the sensors 22-26 may be combined in one integral structure featuring an electronic control unit configured to perform the separate functions described. Finally, it is also appreciated that the sensors 22-26 and controller 14 may be further combined, so that the system 10 presents a completely integrated unit.

Figure 3:
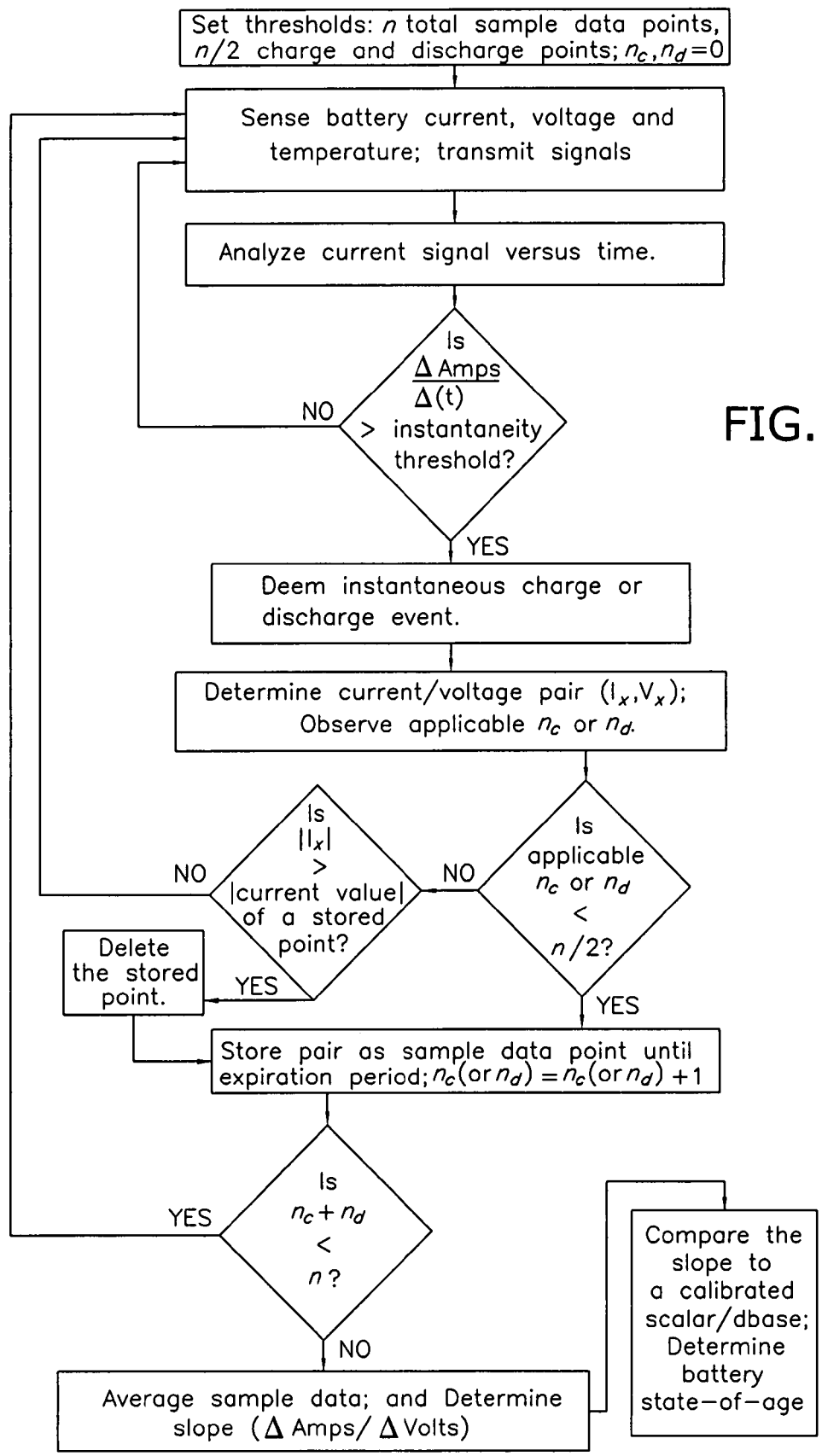
FIG. 3 is a flow chart of a non-repetitive method of determining a battery state-of-age using an adaptive group filter algorithm having charge and discharge event data buckets, in accordance with a preferred embodiment of the invention.

The controller 14 is configured to obtain information from the sensors 22-26 at a predetermined sampling rate that dictates how often the impedance is calculated. The controller 14 preferably utilizes an initial filter (or gate-keeper sub-routine) to selectively communicate only "instantaneous" data to the algorithm, as shown in FIG. 3. As such, the battery impedance is estimated using the most instantaneous events, so that all data not meeting the applied instantaneous criteria can be neglected. The correlative current and voltage value pairs measured during these events are recorded as candidate charge data points for those readings taken during instantaneous charge events, and as candidate discharge data points for those taken during instantaneous discharge events. Collectively a plurality of the n most charge and discharge points are selectively chosen from the lot of candidate points according to their current values, stored in a data bucket for a predetermined expiration period as sample data points, and then averaged and manipulated to estimate the impedance. Thus, the algorithm filters data by analyzing only instantaneous points, by selecting only a sample of n points for regression, and by averaging the sample data points. Finally, the determined impedance is compared to a predefined battery specific calibrated scalar or relational database to estimate a battery state-of-age.

Lastly, the present system 10 is preferably configured to generate an output, such as visible indicia, or an audible or haptic message perceivable by an operator (not shown). For example, the controller 14 may be communicatively coupled to a communication device, such as the dashboard monitor 28 shown in FIG. 1. In this configuration, the controller 14 is preferably operable to cause indicia 30, such as "BATTERY LIFE LOW," to flash upon the monitor 28, when a state-of-age estimate suggests that less than a predetermined threshold (e.g., 10 percent) of the battery life remains. This alerts the operator of the need to replace the battery. More preferably, in addition to or in lieu of the alert, the controller 14 may be further configured to autonomously modify the operation of the vehicle 16, such as for example by controlling a power switch (not shown) which can close or open an interruption in the circuit, or by instructing a fuel injector module to stall the engine.

II. Detailed Simulation and Analysis

Figure 4:
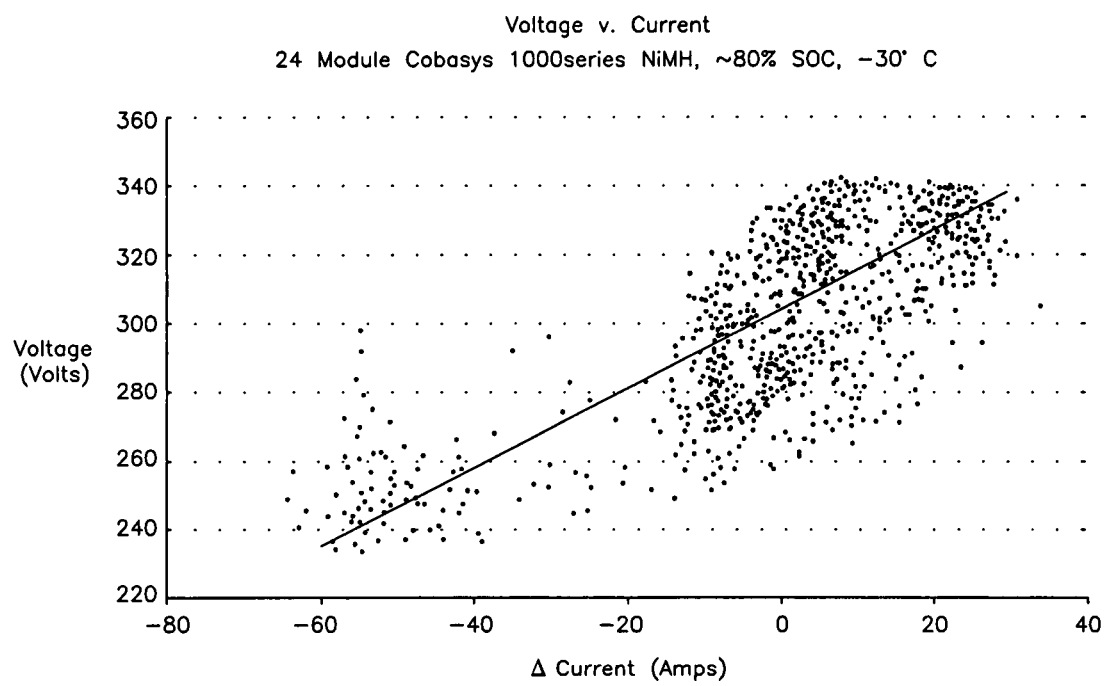
FIG. 4 is a plot and line graph of a sample of data points taken from a complete battery cycle of a 24-module Cobasys 1000 series NiMH battery pack at approximately 80 percent state-of-charge and negative 30 degrees Celsius.

To better illustrate the operation of the present system 10, and to show how well the most instantaneous points selected can represent the entire system response, a simulation was performed and is reflected in FIG. 4. FIG. 4 presents a plurality of plotted current/voltage value pairs for all data measured and a line graph interconnecting averaged charge and discharge sample data points taken from the pairs. The pairs were recorded from a battery cycle of a 24-module Cobasys 1000 series NiMH battery pack at approximately 80 percent state-of-charge and negative 30 degrees Celsius. The simulation evaluated to approximately 50 milliohms per module, which correlates to a 1 kHz milliohm meter reading taken on a Cobasys 1000 series module under the same battery state conditions.

Though a plurality of data pairs meeting instantaneous criteria were delivered to the controller 14, only the n/2 most instantaneous charge points and n/2 most instantaneous discharge points within an expiration period of X seconds comprised the sample data points. It is appreciated that the inclusion of an expiration period establishes separate data buckets as further discussed below and reflected in FIG. 5.

The expiration period, X, is preferably adjustable (potentially dynamically during operation) to aid proper function, according to user preference, or in response to throughput demand. For example, a 10 second expiration time may be implemented, where the controller 14 feeds the algorithm 100 ms current and samples voltage at 100 ms, so that 100 current/voltage pairs may be determined. For a less rapidly adapting algorithm, X could present a larger value, such as 300 seconds, which would be acceptable because instantaneous resistance is a slow moving parameter. More preferably, an autonomous function or human calibrator of the algorithm sets X based upon a predetermined or inputted anticipated current demand profile. If an aggressive profile is anticipated, wherein instantaneous events are in abundance, then X can be small; however, if few instantaneous events are anticipated, then the data bucket points should not expire quickly, and X should be large so as to increase the accuracy of the estimate.

As previously discussed, the variable "n" represents the sample size for consideration when determining the line graph (FIG. 4), and is a subset of the actual data measured. The line is drawn from the average of the n/2 discharge sample data points and the average of the n/2 charge sample data points. Per Ohm's law, which will always remain true due to the magnitude of open-circuit voltage and high frequency resistance with respect to all battery dynamics, the slope (dV/dI) of the line is the internal instantaneous resistance for the highest frequency events and the estimated true impedance at any point in time.

Thus, the algorithm relies upon a tournament prediction scheme in order to make decisions, which means that there are "n" points, wherein n>1, involved in making the decision. In practice, a plurality of six points (i.e., n=6) was found to be sufficient, such that a minimal data bucket is required and reserved in memory. In the simulation n was set to 6. More preferably, each of the buckets also include at least one reserve data point to minimize the chance of calculation error while entering and exiting sample data to and from the buckets. In the simulation, n+2 data points of current and voltage output were stored, with only the most instantaneous n/2 charge and n/2 discharge points being averaged. The extra +2 points represent the events having the next highest current charge and discharge values (an extra one in each data bucket).

Next, the sample data points are averaged to ensure that battery dynamics will induce minimal error into the resistance calculation. This, it is appreciated, increases the robustness of the algorithm, and means that no matter how complex the dynamics for any given battery, the balance of charge and discharge points on opposite sides of the fundamental voltage versus current relationship from which internal resistance is derived, a vast discrepancy in actually measured points will have negligible impact. This makes the algorithm insensitive to the profile of charge and discharge events witnessed by the battery. The provision of positive and negative events being equal (number of charge and discharge points are equitable as "n/2") provides that the slope of the dV/dI line will not be skewed based upon profile bias in either a charge increasing or charge decreasing usage. Even though "n" is a preferably statically predetermined number, it is appreciated that as "n" increases, the output resistance becomes more and more filtered, because adding or removing a point has less and less impact on the calculation. Again, where reserve points are stored, the extra points are not considered in the average, which makes the resultant resistance output more stable.

Figure 5:
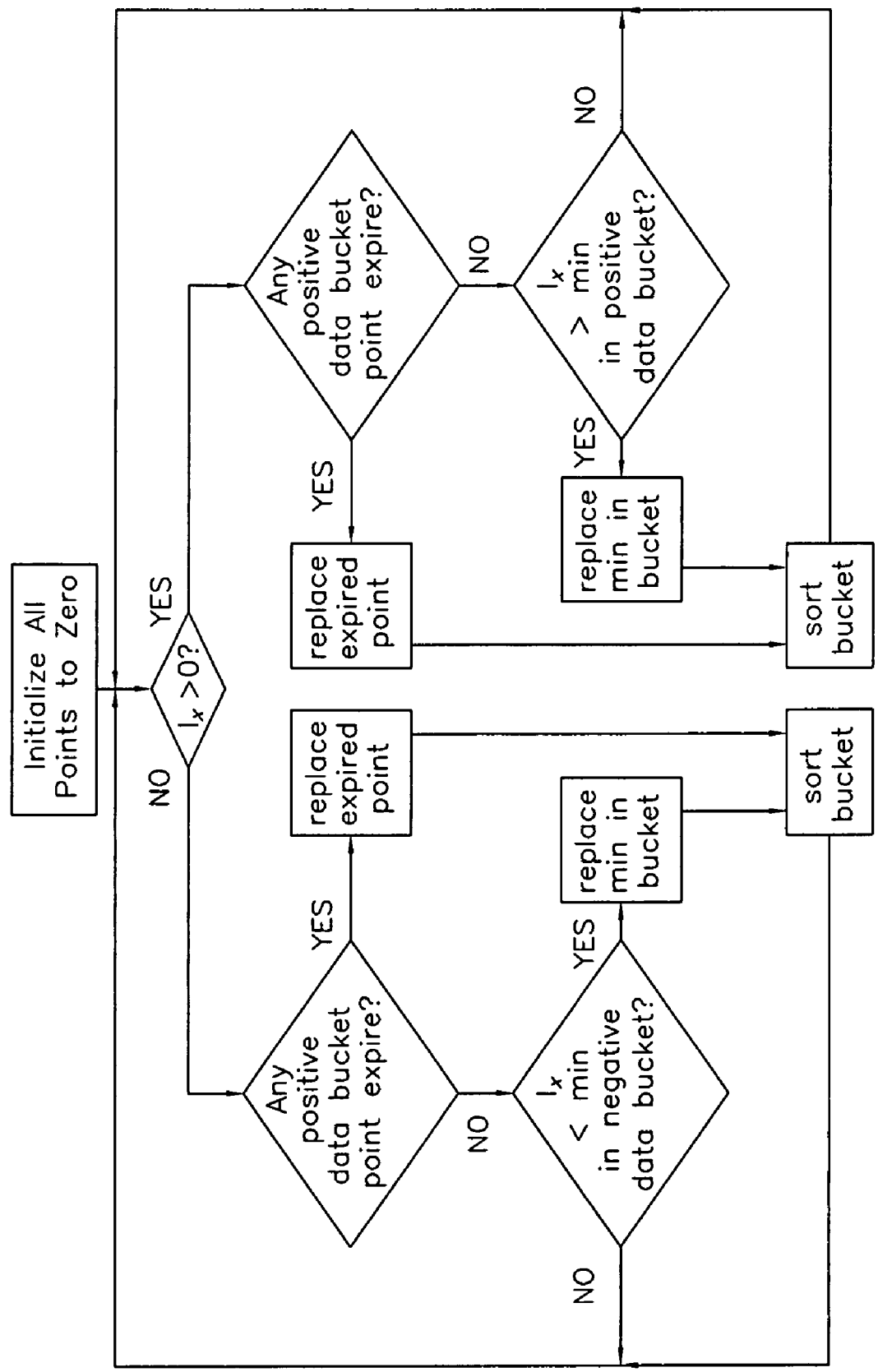
FIG. 5 is a flow chart of a method of storing a sample data point within one of charge and discharge event buckets, in accordance with a preferred embodiment of the invention.

As shown by FIGS. 3 and 5, there are three ways to store data in the buckets: (1) a charge or discharge event is received and the corresponding bucket doesn't have n valid data points in it (because the system has just started running and hasn't encountered n charge and discharge events yet), (2) the bucket has n+1 valid data points in it, but it encounters a data point with a current or power magnitude greater than the smallest magnitude current or power point in a bucket, or (3) any data point in the bucket expiration period expires. If any of these three occurrences happen, where applicable, the corresponding point in the bucket is removed and replaced with the (V,I) pair of the present time step.

Thus, the data buckets are not simply a revolving tracker of the "n" most recent points. When a data point is added to the bucket, its timer starts a countdown of the expiration period. If it is not replaced by a more instantaneous point prior to exhausting the expiration period, it is removed. If a point is replaced, the timers of all points in the data buckets are updated by incrementing their counts by 1. If and only if one of the buckets has had a change in data is that bucket re-averaged to reproduce a new resistance. This makes the algorithm adaptive; otherwise, resistance would begin to saturate. It is appreciated that the reserve points have their own expiration period, which may differ from the sample data point expiration period, to keep the reserve data updated and adaptive. It is also appreciated that as "n" increases, accuracy increases, as long as there are n/2 points within the specified period to satisfy the criteria for instantaneity. Finally, it is within the ambit of the invention to also dynamically change the data bucket size.

Once the internal resistance is derived from the slope, the battery age may be determined by applying a calibration scalar that maps this resistance to age. In a vehicular setting, the calibration scalar may be determined based on the power available to crank the engine at a given temperature, as well as the power, current, and voltage limits of the battery. The power available for crank may be determinable from the formula, $V_{min}*(V_{min}-V_{present})/R$, where $V_{min}$ is the minimum operating voltage for the system application, $V_{present}$ is the voltage sampled at the present time step, and R is the resistance determined by the system. It is appreciated that this number will be negative, in keeping with the sign convention that power discharged from a battery is negative; assuming the battery is required to supply the entire load. Alternatively, a second formula, $I_{max\_discharge}*I_{max\_discharge}*R$, may be used to determine available power, where $I_{max\_discharge}$ is the maximum allowable discharge current for the system application, and $I_{max\_discharge}$ and $V_{min}$ are adjusted for temperature.

In the simulation, the slope was determined to be approximately 1.17 ohms with interconnect resistance; and when matched to a pre-determined calibration scalar for a 24-module Cobasys 1000 series NiMH battery pack at approximately 80 percent state-of-charge and negative 30 degrees Celsius, the battery state-of-age was found to be approximately 15%.

To highlight an advantage of the present invention, it is appreciated that under regression by other means (e.g., finite element analysis of all points), the data shown in FIG. 4 would achieve an optimized line that would be biased due to the larger number of charge data points. It is also appreciated that the inventive battery age determination algorithm is further advantageous in that it is dynamic and adaptive, but need not be unnecessarily calculated. For example, the algorithm could be ran only as long as it needs to discern a value for a particular trip and then stop calculating, so as to increase throughput on a vehicle controller, or more preferably, it can be ran only once per key cycle, since it is appreciated that the power surge required for cranking is the limiting constraint during most trips.

The preferred forms of the invention described above are to be used as illustration only, and should not be utilized in a limiting sense in interpreting the scope of the general inventive concept. Obvious modifications to the exemplary embodiments and methods of operation, as set forth herein, could be readily made by those skilled in the art without departing from the spirit of the present invention. The inventor hereby states his intent to rely on the Doctrine of Equivalents to determine and assess the reasonably fair scope of the present invention as pertains to any system or method not materially departing from but outside the literal scope of the invention as set forth in the following claims.

What is claimed is:

1. A method of estimating the state-of-age of a secondary cell utilizing an adaptive group filter algorithm, said method comprising the steps of:
    a) concurrently sensing a current supplied to and voltage drop across the cell over a sampling period, so as to generate synchronized current and voltage signals;
    b) analyzing the current signal with respect to time, so as to determine a rate of current change and an instantaneous charge or discharge event based on the rate of current change;
    c) determining a correlative pair of candidate current and voltage drop values based on the current and voltage signals when an instantaneous event is determined;
    d) accessing a data bucket to determine a number of previously determined sample data points from like instantaneous events within the sampling period, and storing the pair as a sample data point in the bucket, if the number of previously determined sample data points is less than a minimum quantity, or if the candidate current value is greater than each of the current values of the previously determined sample data points;
    e) averaging the current and voltage drop values of the sample data points, when the number of stored points reaches the minimum quantity for each of said instantaneous charge and discharge events;
    f) determining the change in the current value between the average of the charge and discharge events divided by the change in the voltage drop value between the average of the charge and discharge events, so as to calculate a resistance slope; and
    g) determining a battery state-of-age based on the slope.

2. The method as claimed in claim 1, wherein step b) further includes the steps of determining an instantaneous event when the rate of current change exceeds 2000 amperes/sec.

3. The method as claimed in claim 1, wherein step b) further includes the steps of determining an instantaneous event based upon an analysis of historical charge and discharge events and when the rate of current change is within a predetermined percentile of the historical events.

4. The method as claimed in claim 1, wherein steps a), c) and g) further include the steps of concurrently sensing the current supplied to, voltage drop across, and a temperature at or near the battery, so as to generate a correlative temperature signal, determining a correlative trio of candidate current, voltage drop, and temperature values based on the current, voltage and temperature signals when an instantaneous event is determined, determining an average sample data point temperature, and comparing the slope and average temperature to a predefined relational database, so as to determine a matching battery state-of-age.

5. The method as claimed in claim 1, wherein step d) further includes the steps of storing the pair and the previously determined sample data points, each over an independently commencing and terminating expiration period less than the sampling period, and steps e) through g) are cyclically performed, so as to calculate a plurality of resistance slopes and determine a plurality of matching battery states-of-ages over the sampling period.

6. The method as claimed in claim 5, wherein step a) further includes the steps of determining an anticipated current or power demand profile for the battery, and autonomously adjusting the sampling or expiration period accordingly.

7. The method as claimed in claim 1, wherein step d) further includes the steps of storing a total minimum quantity of n sample data points, including n/2 instantaneous charge event points and n/2 instantaneous discharge event points, such that the minimum quantities for said charge and discharge events are equal.

8. The method as claimed in claim 7, wherein n is 6.

9. The method as claimed in claim 7, wherein n is adjustable by an operator.

10. The method as claimed in claim 7, wherein step a) further includes the steps of determining an anticipated current or power profile for the battery, and autonomously adjusting n accordingly.

11. The method as claimed in claim 1, wherein step d) further includes the steps of storing a total minimum quantity of n+2 sample data points, including (n+2)/2 instantaneous charge event points and (n+2)/2 instantaneous discharge points, such that the minimum quantities for said charge and discharge events are equal, and step e) further includes the steps of averaging the current and voltage drop values of the sample data points, excluding the sample points having lowest charge current value and highest discharge current value, when the number of stored points reaches the minimum quantity for each of said instantaneous charge and discharge events.

12. The method as claimed in claim 1, wherein step g) further includes the steps of determining the battery state-of-age by comparing the slope to a calibration scalar that masks battery state-of-age for the battery.

13. The method as claimed in claim 12, wherein said method is used with a vehicle having an engine, and step g) further includes the steps of determining the battery state-of-age by comparing the slope to a calibration scalar based on the power available to crank the engine, and the power, current and voltage limits of the battery.

14. The method as claimed in claim 13, wherein the power available to crank the engine is determinable according to the formula $V_{min}*(V_{min}-V_{present})/R$, where R is the derived adaptive resistance, and $V_{present}$ is the battery operating voltage at the time of the crank event.

15. The method as claimed in claim 13, wherein the power available to crank the engine is determinable according to the formula $I_{max\_discharge}*I_{max\_discharge}*R$, where R is the derived adaptive resistance and $I_{max\_discharge}$ is adjusted according to temperature.

16. The method as claimed in claim 1, wherein step g) further includes the steps of determining the battery state-of-age by comparing the slope to predefined relational database.

17. A method of estimating the state-of-age of a secondary cell utilizing an adaptive group filter algorithm, adapted for use with a vehicle having a cranking engine, said method comprising the steps of:
    a) concurrently sensing a current supplied to and voltage drop across a battery over a sampling period, so as to generate synchronized current and voltage signals;
    b) analyzing the current signal with respect to time, so as to determine a rate of current change and an instantaneous charge or discharge event based on the rate of current change;

c) determining a correlative pair of candidate current and voltage drop values based on the current and voltage signals when an instantaneous event is determined;

d) determining a number of previously determined sample data points from like instantaneous events within the sampling period, and storing the pair as a sample data point, if the number of previously determined sample data points is less than a minimum quantity, or if the candidate current value is greater than each of the current values of the previously determined sample data points, wherein a total minimum quantity of n sample data points are stored, including n/2 instantaneous charge event points and n/2 instantaneous discharge event points, such that the minimum quantities for said charge and discharge events are equal;

e) averaging the current and voltage drop values of the sample data points, when the number of stored points reaches the minimum quantity for each of said instantaneous charge and discharge events;

f) determining the change in the average current values between the charge and discharge events divided by the change in the average voltage drop values between the charge and discharge events, so as to calculate a resistance slope; and g) determining a battery state-of-age by comparing the slope to a calibration scalar based on the power available to crank the engine, and the power, current and voltage limits of the battery.

18. A system for estimating the state-of-age of a battery within a completed circuit and selectively alerting an operator, said system comprising:

at least one current sensor configured to determine a supplied current to the battery over a sampling period, and generate a current signal;

at least one voltage sensor configured to determine the voltage drop across the battery over the period, and generate a voltage signal;

a controller communicatively coupled to the current and voltage sensors and configured to analyze the current signal with respect to time, so as to determine a rate of current change and an instantaneous charge or discharge event based on the rate of current change, determine a correlative pair of candidate current and voltage drop values based on the current and voltage signals when an instantaneous event is determined, determine the number of previously determined sample data points from like instantaneous events within the period and store the pair as a sample data point, if the number of previously determined sample data points is less than a minimum quantity, or if the candidate current value is greater than each of the current values of the previously determined sample data points, average the current and voltage drop values of the stored sample data points, when the number of stored data points reaches the minimum quantity for each of said instantaneous charge and discharge events, determine the change in the average current values between the charge and discharge events divided by the change in the average voltage drop values between the charge and discharge events, so as to determine a resistance slope, and compare the slope to a predetermined relational database, so as to determine a matching battery state-of-age; and a communication device communicatively coupled to the controller, said controller being further configured to selectively cause an alert to be generated by the device, based upon the battery state-of-age.

19. The system as claimed in claim 18, wherein said sensors are wirelessly coupled and configured to continuously transmit a current and voltage signal to the controller.

20. The system as claimed in claim 18, wherein the controller is further configured to autonomously modify the operation of the circuit in addition to or in lieu of the alert, based upon the battery state-of-age.

* * * * *